(12) United States Patent
Feng

(10) Patent No.: US 7,006,016 B1
(45) Date of Patent: Feb. 28, 2006

(54) DC-FREE LINE CODES

(75) Inventor: Weishi Feng, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 10/937,995

(22) Filed: Sep. 10, 2004

Related U.S. Application Data

(60) Provisional application No. 60/510,266, filed on Oct. 10, 2003.

(51) Int. Cl.
*H03M 5/00* (2006.01)
(52) U.S. Cl. ...................................................... 341/58
(58) Field of Classification Search ............... 341/69, 341/50, 144, 150, 153, 118, 58; 714/739, 714/738, 742, 45, 47, 49, 268, 275; 380/46, 380/47, 49, 268, 275
See application file for complete search history.

(56) References Cited

U.S. PATENT DOCUMENTS

| | | | |
|---|---|---|---|
| 4,486,739 A | | 12/1984 | Franaszek et al. |
| 5,966,447 A | * | 10/1999 | Nishida et al. ............... 380/28 |
| 6,177,890 B1 | * | 1/2001 | Keirn et al. .................. 341/59 |
| 6,351,538 B1 | * | 2/2002 | Uz ............................. 380/201 |
| 6,462,691 B1 | * | 10/2002 | Rudberg et al. ............ 341/144 |
| 6,792,566 B1 | * | 9/2004 | Chen et al. .................. 714/739 |

OTHER PUBLICATIONS

U.S. Appl. No. 10/423,552, filed Apr. 25, 2003, Weishi et al.
U.S. Appl. No. 10/639,796, filed Aug. 12, 2003, Weishi et al.
U.S. Appl. No. 10/701,271, filed Nov. 4, 2003, Weishi et al.
U.S. Appl. No. 10/701,661, filed Nov. 5, 2003, Weishi.
U.S. Appl. No. 10/715,551, filed Nov. 17, 2003, Weishi.
U.S. Appl. No. 10/714,804, filed Nov. 17, 2003, Weishi.

* cited by examiner

*Primary Examiner*—Brian Young

(57) ABSTRACT

A data encoding system for a data stream comprises a data dependent scrambler that receives the data stream including K m-bit symbols, that selects a seed based on the K m-bit symbols, that scrambles the K m-bit symbols using the seed and that outputs a codeword including the scrambled K m-bit symbols and the seed. A DC control module receives a plurality of the codewords from the data dependent scrambler, selectively inverts selected ones of the plurality of codewords to reduce a difference between a total number of zeroes and total number of ones in the plurality of codewords and outputs an encoded data stream.

42 Claims, 4 Drawing Sheets

DC-FREE LINE CODES

CROSS-REFERENCE TO RELATED APPLICATIONS

This application is related to U.S. Ser. No. 10/423,552, filed Apr. 25, 2003, entitled, "Improved Data Coding For Enforcing Constraints On Ones And Zeros In A Communications Channel", U.S. Ser. No. 10/639,796, filed Aug. 12, 2003, entitled, "Methods And Apparatus For Improving Minimum Hamming Weights Of A Sequence", U.S. Ser. No. 10/701,271, filed Nov. 4, 2003, entitled, "Methods Of Supporting Host CRC In Data Storage Systems Without RLL Coding", U.S. Ser. No. 10/715,551, filed Nov. 17, 2003, entitled, "Data Dependent Scrambler With Reduced Overhead", U.S. Ser. No. 10/701,661, filed Nov. 5, 2003, entitled, "Reducing Number Of Consecutive Ones In Data Dependent Scrambler", U.S. Ser. No. 10/714,804, filed Nov. 17, 2003, entitled, "Data Dependent Scrambler With Improved Global Constraint". This application claims the benefit of U.S. Provisional Application No. 60/510,266, filed on Oct. 10, 2003. The disclosure of the above applications are incorporated herein by reference.

FIELD OF THE INVENTION

The present invention relates to data coding in communications channels, and more particularly to DC-free data coding.

BACKGROUND OF THE INVENTION

Many communication systems are constrained as to the types of signals that can be communicated. Often, energy at low frequencies is undesirable for reasons such as greater power dissipation in the receiver/transmitter and high-pass frequency characteristics of the communications channel. In a binary data stream, the amount of low frequency content is determined by the number of consecutive 1's or 0's in the data stream, and by imbalance in the total number of 1's and 0's transmitted. Line codes are used in digital communication systems to reduce this low frequency energy.

The widely used 8b/10b line code generates a binary data stream containing no more than five consecutive 1's or 0's, and is DC-free. DC-free means that the total number of 1's transmitted minus the total number of 0's transmitted is bounded on either side of zero by two constants. The two constants are often opposites of each other. The 8b/10b code replaces each 8 bits of user data with 10 bits of coded data. Increasing the number of bits by 2, from 8 to 10, means that there is 25% (2/8) redundancy in the 8b/10b code.

SUMMARY OF THE INVENTION

A data encoding system for a data stream comprises a data dependent scrambler that receives the data stream including K m-bit symbols, that selects a seed based on the K m-bit symbols, that scrambles the K m-bit symbols using the seed and that outputs a codeword including the scrambled K m-bit symbols and the seed. A DC control module receives a plurality of the codewords from the data dependent scrambler, selectively inverts selected ones of the plurality of codewords to reduce a difference between a total number of zeroes and total number of ones in the plurality of codewords and outputs an encoded data stream.

In some embodiments, the data dependent scrambler includes a seed selector that receives the K m-bit symbols and that selects the m-bit seed. The data dependent scrambler further includes a scrambling module that scrambles the K m-bit symbols using the m-bit seed to create the scrambled K m-bit symbols.

In some embodiments, the seed selector selects the m-bit seed such that the m-bit seed is not equal to the K m-bit symbols and inversions thereof. The seed selector selects the m-bit seed such that the seed is not equal to the K m-bit symbols and inversions thereof, an all-zero symbol, and an all-one symbol.

In some embodiments, the DC control module comprises a digital sum (DS) calculator that receives the codeword and that calculates the DS of the codeword. The DS is equal to the number of ones in the codeword minus the number of zeroes in the codeword.

In some embodiments, the DC control module further comprises an inverter that selectively inverts the codeword when an enable signal is received. The DC control module further comprises a running digital sum (RDS) module that receives the DS and that calculates the RDS of a plurality of codewords. The DC control module further comprises an RDS comparing module that receives the DS and the RDS and that selectively generates the enable signal. The RDS comparing module selectively reverses the sign of the DS. The RDS comparing module selectively generates the enable signal and reverses the sign of the DS when the RDS and the DS have the same sign.

A read channel circuit comprises the data encoding system.

A storage device comprises the data encoding system.

A disk drive comprising the data encoding system.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

Figure 1A:
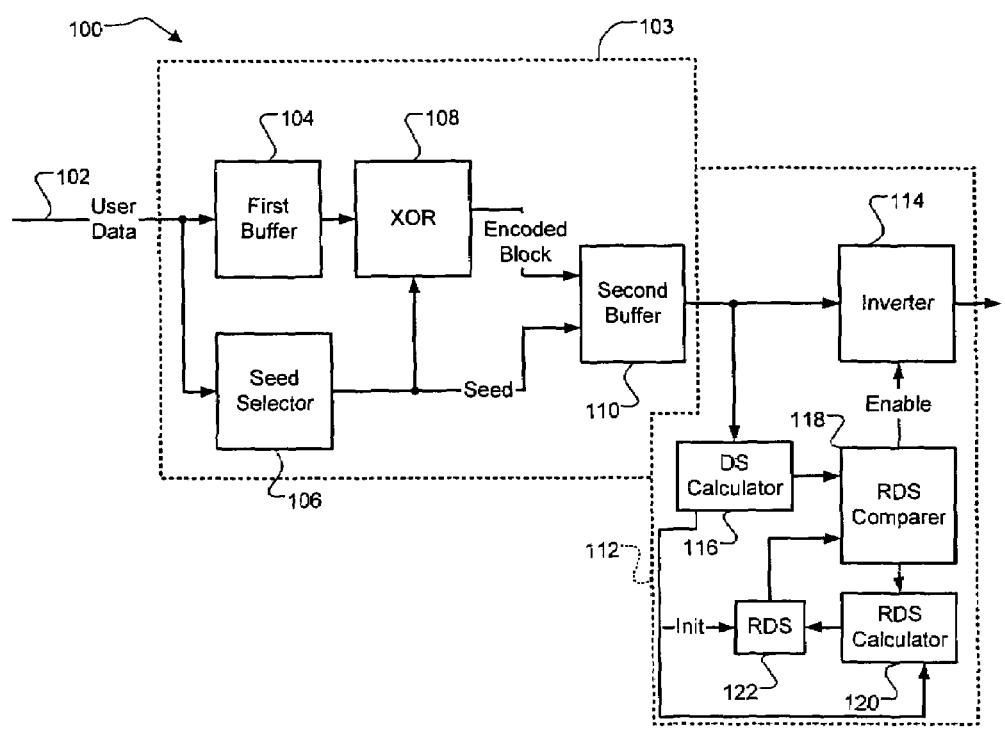
FIG. 1A is a functional block diagram illustrating an exemplary encoder according to the principles of the present invention.

The following description of the preferred embodiments is merely exemplary in nature and is in no way intended to limit the invention, its application, or uses. For purposes of clarity, the same reference numbers will be used in the drawings to identify similar elements. As used herein, the term module refers to an application specific integrated circuit (ASIC), an electronic circuit, a processor (shared, dedicated, or group) and memory that execute one or more software or firmware programs, a combinational logic circuit, and/or other suitable components that provide the described functionality.

Referring now to FIG. 1A, an exemplary encoder 100 is depicted. User data 102 can be grouped into symbols of m bits each. Symbols can be further grouped into data blocks of K symbols each. Each data block contains m*K number of bits. A data dependent scrambler (DDS) 103 includes a first buffer 104 and a seed selector 106 receive the user data 102 one data block (m*K bits) at a time. The seed selector 106 selects an m-bit seed based upon the received data block. The seed selector 106 communicates with a first input of an XOR module 108, and the first buffer 104 communicates with a second input of the XOR module 108. The XOR module 108 performs a logical XOR between the selected seed and each user data symbol. The XOR module 108 and the seed selector 106 both communicate with a second buffer 110. The second buffer 110 appends the XOR'd data symbols to the seed, creating a codeword containing m*(K+1) bits. The second buffer 110 communicates with a DC control module 112. The DC control module 112 receives the codeword from the second buffer 110 and generates encoded output that is DC-free.

The seed selector 106 receives user data 102 and operates on it in groups of m*K bits. This m*K bit group is referred to as a data block, and is divided into K symbols of m bits each. The seed selector 106 selects a seed S that is not equal to any of the K symbols or their inversions. The XOR module 108 will perform a logical XOR on each symbol of the data block with S. Because S is not equal to any of the symbols of the data block, Boolean logic dictates that the output of the XOR module 108 will contain no all-zero symbols. Likewise, because S is not equal to the inversion of any of the data block symbols, the XOR module 108 will not output all-one symbols. The seed selector 106 may be further limited in that it cannot choose the all-zero symbol or the all-one symbol as the seed. With these restrictions, the resulting codeword will contain no all-zero or all-one symbols.

The number of different m-bit binary symbols is $2^m$. Because S must not be the all-zero or all-one symbols, the maximum number of possible seeds is $2^m-2$. In the most extreme case, each of the K symbols in the data block will not be equal to any other symbol, any other symbol's inversion, or the all-zero or all-one symbols. That would mean that there are an additional 2*K symbols (the unique symbols plus their unique inversions) that cannot be selected for the seed. Therefore, the number of possible seeds in this case is $2^m-2-2*K$. If this number is less than zero, m must be increased or K decreased until this number is greater than zero. This will guarantee that at least one valid seed will exist, even in the most extreme case. The seed selector 106 selects any one of the possible seeds and communicates it to the first input of the XOR module 108. The second input of the XOR module 108 receives the K-symbol data block from the first buffer 104, one symbol at a time. The XOR module 108 performs a logical XOR of each symbol with S, and communicates the result to the second buffer 110.

The second buffer 110 appends S to the K XOR'd symbols of the data block. These K+1 symbols are referred to as a codeword. The maximum number of consecutive 0's or 1's in the resulting codeword is equal to 2*m−2. For example, when m is equal to 4, the longest run of consecutive zeroes would occur with the adjacent symbols 1000 0001. The six consecutive 0's matches the six predicted by the expression 2*m−2(2*4−2=6).

However, simply because the number of consecutive 0's and 1's is limited, a sequence is not guaranteed to be DC-free. A digital sum (DS) can be defined that is equal to the number of 1's minus the number of 0's in a codeword. A summation of the digital sums of all previous codewords is referred to as a running digital sum (RDS). It is well known that if the RDS is bounded, then the coded sequence is DC-free. In FIG. 1, to accomplish this, the second buffer 110 communicates the codeword to the DC control module 112.

The DC control module 112 consists of an inverter 114, a DS calculator 116, an RDS comparer 118, and an RDS calculator 120, which use a variable RDS 122. RDS 122 is initialized to zero when the DC control module 112 is turned on. The inverter 114 and DS calculator 116 both receive the codeword from the second buffer 110. The DS calculator 116 calculates the DS of the codeword, and communicates the result to the RDS comparer 118. The RDS comparer 118 receives RDS 122, compares the DS to the RDS, and communicates an enable signal to the inverter 114 and reverses the sign of DS if the signs of DS and RDS are the same. The RDS calculator 120 then replaces RDS 122 with the sum of DS and RDS. The inverter 114, if it receives the enable signal, bitwise inverts the codeword, and outputs the resulting inverted codeword. Otherwise, the inverter 114 outputs the codeword unchanged.

Figure 1B:
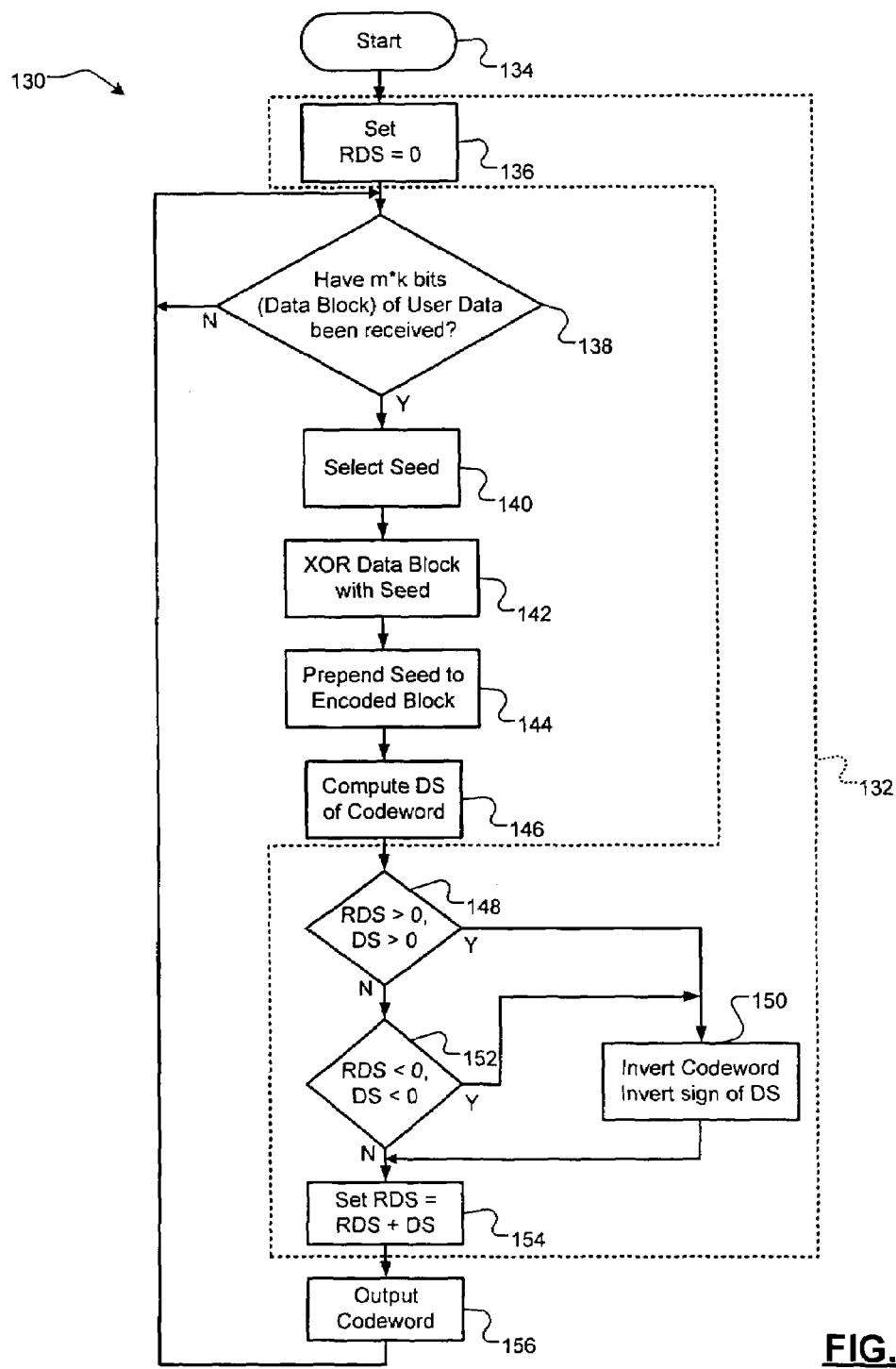
FIG. 1B is a flow chart illustrating steps performed by an exemplary encoder.

FIG. 1B is a flowchart illustrating the steps performed by an exemplary encoder 130. Operation of the DC control module 112 is indicated by reference number 132. Control begins at step 134. A variable, RDS, is initialized to zero in step 136. The system waits for m*K bits of user data (a data block) to be received in step 138. Once it has been received, the encoder selects a seed in step 140 that is not equal to all 1's, all 0's, or one of the m data block symbols or their inversions. Each symbol of the data block is XOR'd with the selected seed in step 142. The seed is then appended to the XOR'd data block in step 144, creating a codeword. Next the encoder computes the digital sum (DS) of the codeword in step 146.

To achieve DC-free output, the RDS must be kept as close to zero as possible. The RDS is summed with the DS of each codeword. Therefore, if DS is greater than zero and RDS is already greater than zero in step 148, control transfers to step 150, where the codeword is bitwise inverted. Because 1's have been replaced with 0's and vice versa, the sign of DS is now inverted in step 150. Likewise, in step 152, if DS is less than zero, and RDS is already less than zero, control transfers to step 150 so that DS will be inverted. After the codeword and DS are inverted in step 150, control continues at step 154. If neither condition is true, the codeword is not inverted, DS remains unchanged, and control resumes with step 154. The value of RDS is replaced by the sum of RDS and DS in step 154. The codeword is then output in step 156 and control returns to step 138.

The maximum divergence of RDS from zero (i.e., the greatest absolute value of RDS) can be determined analytically. If RDS is positive, the DC control module 112 will cause the sign of DS to be negative. The resulting absolute value of RDS will be equal to | |RDS|−|DS| |, which is the same as | |DS|−|RDS| |. Similarly, if RDS is negative, DS will be made positive, and the resulting absolute value of RDS will be equal to | |DS|−|RDS| |. If RDS is equal to zero, the sign of DS is immaterial, and the absolute value of RDS will be equal to |DS|. Of these three possible scenarios, the third results in the greatest absolute value of RDS, as in the others |DS| is reduced by the previous absolute value of RDS. The greatest possible divergence of RDS from zero is thus determined by the maximum possible value of DS.

The maximum value of DS will occur when the largest number of identical bits in a codeword are present. As discussed above, the seed selection guarantees that the codeword will contain no all-zero or all-one symbols. The maximum number of either 1's or 0's in a symbol is thus equal to m−1. A codeword contains K+1 symbols. The maximum possible value of DS is then equal to the number of symbols (K+1) times the maximum number of identical bits in a symbol (m−1). Therefore, RDS is bounded by +/−(m−1)*(K+1). That is, |RDS|≦(m−1)*(K+1).

Parameters of merit for various embodiments are presented in the following table.

| m | $K_{max}$ | $R_{max}$ | $R_{bound}$ | Redundancy |
|---|---|---|---|---|
| 4 | 6 | 6 | 21 | 16.7% |
| 5 | 14 | 8 | 60 | 7.1% |
| 6 | 30 | 10 | 155 | 3.3% |
| 7 | 62 | 12 | 378 | 1.6% |
| 8 | 126 | 14 | 889 | 0.79% |

The column m denotes the number of bits in a symbol. $K_{max}$ is the maximum number of symbols in one data block, and is determined such that a valid seed is guaranteed to exist. As determined above, $2^m-2-2*K$ must be greater than zero. When solved for K, this yields $K<2^{m-1}-1$. Because $K_{max}$ is a whole number, it will be equal to $2^{m-1}-2$. $R_{max}$ is the maximum number of consecutive 1's or 0's present in the output of the encoder, and as stated above is equal to 2*m−2. $R_{bound}$ is the upper boundary of the absolute value of the running digital sum, such that $|RDS|≦R_{bound}$. $R_{bound}$ is equal to (m−1)*(K+1) in this embodiment. Redundancy is the additional proportion of bits used by the encoding system. Because one additional symbol, the seed, is added to the K data symbols, redundancy is equal to 1/K.

Figure 2A:
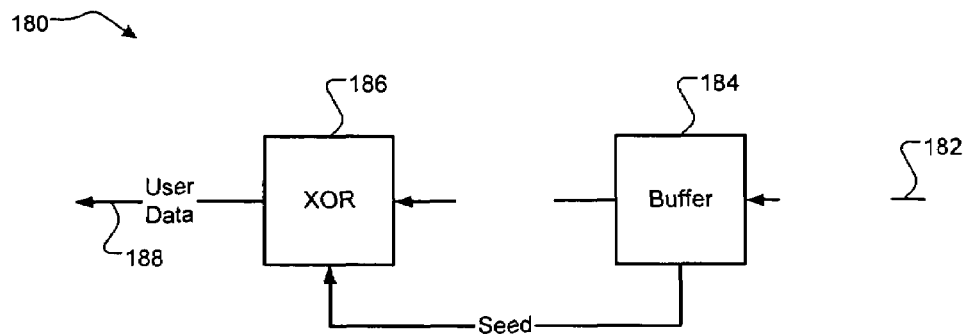
FIG. 2A is a functional block diagram illustrating an exemplary decoder according to the principles of the present invention.

Referring now to FIG. 2A, an exemplary decoder 180 is presented that decodes encoded data 182. A buffer 184 receives the encoded data 182 in increments of one codeword (m*(K+1) bits). A seed, which is the first symbol of the codeword, is communicated to a first input of an XOR module 186. The buffer 184 communicates each of the remaining K symbols of the codeword to a second input of the XOR module 186. The XOR module 186 performs a logical XOR on its two inputs, and the resulting user data is output from the XOR module 186. In Boolean algebra, inverting the two inputs to an XOR function produces the same output as if neither input had been inverted. Because the DC control module 112 of the encoder 100 inverts both the seed and the data symbols when encoding a codeword, the XOR module 186 does not need to recognize whether the codeword had been inverted or not.

Figure 2B:
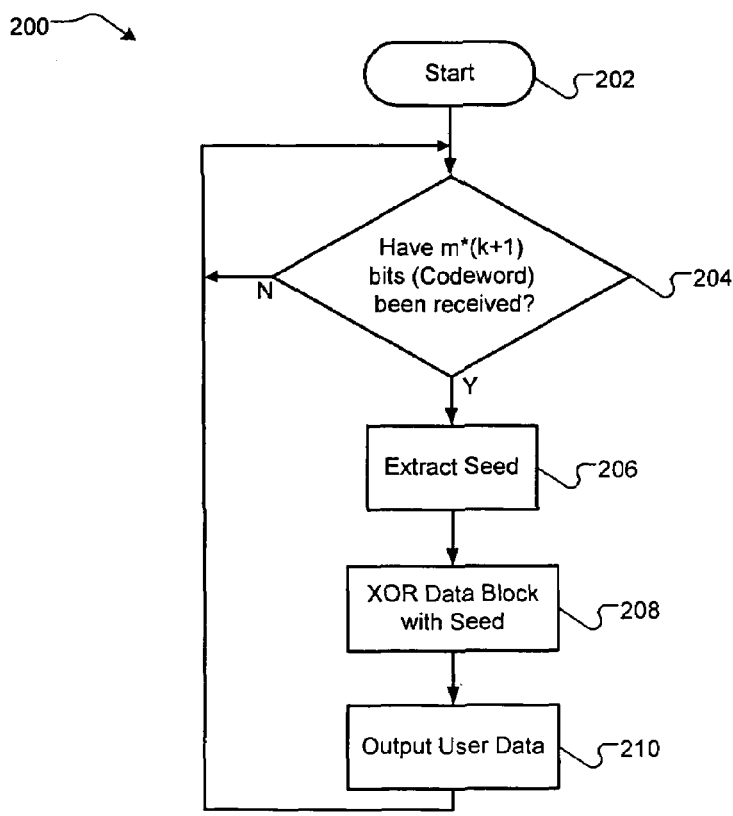
FIG. 2B is a flow chart illustrating steps performed by an exemplary decoder.

Referring now to FIG. 2B, a flow chart depicting operation of an exemplary decoder 200 is presented. Control starts at step 202. Once m*(K+1) bits (a codeword) are received in step 204, the first m-bit symbol is extracted from the codeword, and designated as the seed in step 206. The decoder XORs each remaining symbol of the data block with the seed in step 208. The resulting user data is then output in step 210, and control returns to step 204.

Figure 3:
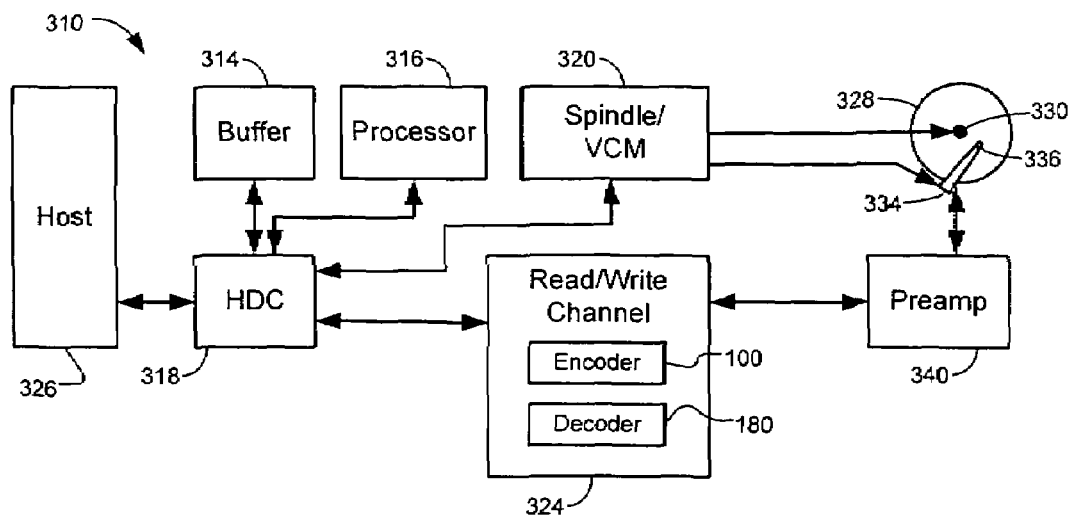
FIG. 3 is a functional block diagram of a magnetic storage device that includes a read channel with an encoder and/or decoder of FIGS. 1A–2B.

Referring now to FIG. 3, an exemplary magnetic storage system 310 (such as a hard disk drive) is shown. A buffer 314 stores data that is associated with the control of the hard disk drive and/or buffers data to optimize block sizes for increased transfer speed. The buffer 314 may employ SDRAM or other types of low latency memory. A processor 316 performs processing that is related to the operation of the hard disk drive. A hard disk controller (HDC) 318 communicates with the buffer 314, the processor 316, a spindle/voice coil motor (VCM) driver 320, and/or a read/write channel circuit 324. The read/write channel circuit 324 includes the encoder 100 and/or decoder 180 as described above. A host 326 sends data read/write requests to the HDC 318.

During a write operation, the read/write channel circuit (or read channel circuit) 324 encodes the data to be written onto the storage medium. The read/write channel circuit 324 processes the signal for reliability and performs encoding/decoding. During read operations, the read/write channel circuit 324 converts an analog output from the medium to a digital signal. The converted signal is then detected and decoded by known techniques to recover the data written on the hard disk drive.

One or more platters 328 include a magnetic coating that stores magnetic fields. The platters 328 are rotated by a spindle motor that is schematically shown at 330. Generally the spindle motor 330 rotates the platter 328 at a fixed speed during the read/write operations. One or more read/write arms 334 move relative to the platters 328 to read and/or write data to/from the platters 328. The spindle/VCM driver 320 controls the spindle motor 330, which rotates the platter 328. The spindle/VCM driver 320 also generates control signals that position the read/write arm 334, for example using a voice coil actuator, a stepper motor or any other suitable actuator.

A read/write device 336 is located near a distal end of the read/write arm 334. The read/write device 336 includes a write element such as an inductor that generates a magnetic field. The read/write device 336 also includes a read element (such as a magneto-resistive (MR) sensor) that senses the magnetic fields on the platter 328. A preamplifier (preamp) 340 amplifies analog read/write signals. When reading data, the preamp 340 amplifies low level signals from the read element and outputs the amplified signal to the read/write channel circuit 324. The preamp 340 may include a high pass amplifier. While writing data, a write current that flows through the write element of the read/write channel circuit 324 is switched to produce a magnetic field having a positive or negative polarity. The positive or negative polarity is stored by the platter 28 and is used to represent data.

Figure 4:
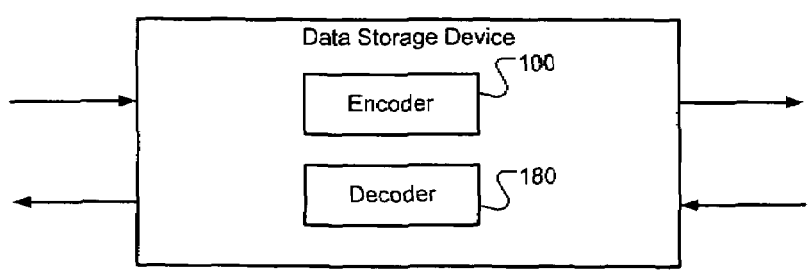
FIG. 4 is a functional block diagram of a data storage device that includes an encoder and/or decoder of FIGS. 1A–2B.

The data encoding system can be incorporated into other storage devices as shown in FIG. 4 according to other embodiments. The storage device may be magnetic, optical or other suitable storage device/medium. The present invention may also be used in any data communications channel. Still other applications will be readily apparent to skilled artisans.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, the specification and the following claims.

What is claimed is:

1. A data encoding system for a data stream, comprising:
    a data dependent scrambler that receives the data stream including K m-bit symbols, that selects a seed based on the K m-bit symbols, that scrambles the K m-bit symbols using the seed and that outputs a codeword including the scrambled K m-bit symbols and the seed; and a DC control module that receives a plurality of the codewords from the data dependent scrambler, that selectively inverts selected ones of the plurality of codewords to reduce a difference between a total number of zeroes and total number of ones in said plurality of codewords and that outputs an encoded data stream.

2. The data encoding system of claim 1 wherein the data dependent scrambler includes a seed selector that receives the K m-bit symbols and that selects the m-bit seed.

3. The data encoding system of claim 2 wherein the data dependent scrambler further includes a scrambling module that scrambles the K m-bit symbols using the m-bit seed to create the scrambled K m-bit symbols.

4. The data encoding system of claim 2 wherein the seed selector selects the m-bit seed such that the m-bit seed is not equal to the K m-bit symbols and inversions thereof.

5. The data encoding system of claim 2 wherein the seed selector selects the m-bit seed such that the seed is not equal to the K m-bit symbols and inversions thereof, an all-zero symbol, and an all-one symbol.

6. The data encoding system of claim 1 wherein the DC control module comprises a digital sum (DS) calculator that receives the codeword and that calculates the DS of the codeword.

7. The data encoding system of claim 6 wherein the DS is equal to the number of ones in the codeword minus the number of zeroes in the codeword.

8. The data encoding system of claim 6 wherein the DC control module further comprises an inverter that selectively inverts the codeword when an enable signal is received.

9. The data encoding system of claim 8 wherein the DC control module further comprises a running digital sum (RDS) module that receives the DS and that calculates the RDS of a plurality of codewords.

10. The data encoding system of claim 9 wherein the DC control module further comprises an RDS comparing module that receives the DS and the RDS and that selectively generates the enable signal.

11. The data encoding system of claim 10 wherein the RDS comparing module selectively reverses the sign of the DS.

12. The data encoding system of claim 11 wherein the RDS comparing module selectively generates the enable signal and reverses the sign of the DS when the RDS and the DS have the same sign.

13. A system comprising the data encoding system of claim 1 and further comprising a data decoding module that receives the encoded data stream including the plurality of codewords, that recovers the m-bit seed for each of the plurality of codewords, and that descrambles the K m-bit symbols using the m-bit seed.

14. A read channel circuit comprising the data encoding system of claim 1.

15. A storage device comprising the data encoding system of claim 1.

16. A disk drive comprising the data encoding system of claim 1.

17. A data encoding system for a data stream, comprising:
data dependent scrambling means for receiving the data stream including K m-bit symbols, for selecting a seed based on the K m-bit symbols, for scrambling the K m-bit symbols using the seed and for outputting a codeword including the scrambled K m-bit symbols and the seed; and DC control means for receiving a plurality of the codewords from the data dependent scrambling means, for selectively inverting selected ones of the plurality of codewords to reduce a difference between a total number of zeroes and total number of ones in said plurality of codewords and for outputting an encoded data stream.

18. The data encoding system of claim 17 wherein the data dependent scrambling means includes seed selecting means for receiving the K m-bit symbols and for selecting the m-bit seed.

19. The data encoding system of claim 18 wherein the data dependent scrambling means further includes scrambling means for scrambling the K m-bit symbols using the m-bit seed to create the scrambled K m-bit symbols.

20. The data encoding system of claim 18 wherein the seed selecting means selects the m-bit seed such that the m-bit seed is not equal to the K m-bit symbols and inversions thereof.

21. The data encoding system of claim 18 wherein the seed selecting means selects the m-bit seed such that the seed is not equal to the K m-bit symbols and inversions thereof, an all-zero symbol, and an all-one symbol.

22. The data encoding system of claim 17 wherein the DC control means comprises digital sum (DS) calculating means for receiving the codeword and for calculating the DS of the codeword.

23. The data encoding system of claim 22 wherein the DS is equal to the number of ones in the codeword minus the number of zeroes in the codeword.

24. The data encoding system of claim 22 wherein the DC control means further comprises inverting means for selectively inverting the codeword when an enable signal is received.

25. The data encoding system of claim 24 wherein the DC control means further comprises running digital sum (RDS) means for receiving the DS and for calculating the RDS of a plurality of codewords.

26. The data encoding system of claim 25 wherein the DC control means further comprises RDS comparing means for receiving the DS and the RDS and for selectively generating the enable signal.

27. The data encoding system of claim 26 wherein the RDS comparing means selectively reverses the sign of the DS.

28. The data encoding system of claim 27 wherein the RDS comparing means selectively generates the enable signal and reverses the sign of the DS when the RDS and the DS have the same sign.

29. A system comprising the data encoding system of claim 17 and further comprising data decoding means for receiving the encoded data stream including the plurality of codewords, for recovering the m-bit seed for each of the plurality of codewords, and for descrambling the K m-bit symbols using the m-bit seed.

30. A read channel circuit comprising the data encoding system of claim 17.

31. A storage device comprising the data encoding system of claim 17.

32. A disk drive comprising the data encoding system of claim 17.

33. A method for encoding data in a data stream, comprising:
   selecting a seed based on K m-bit symbols in the data stream;
   scrambling the K m-bit symbols using the seed;
   outputting a codeword including the scrambled K m-bit symbols and the seed;
   selectively inverting selected ones of the plurality of codewords to reduce a difference between a total number of zeroes and total number of ones in said plurality of codewords; and
   outputting an encoded data stream.

34. The method of claim 33 further comprising selecting the m-bit seed such that the m-bit seed is not equal to the K m-bit symbols and inversions thereof.

35. The method of claim 33 further comprising selecting the m-bit seed such that the seed is not equal to the K m-bit symbols and inversions thereof, an all-zero symbol, and an all-one symbol.

36. The method of claim 33 further comprising calculating a digital sum (DS) of the codeword.

37. The method of claim 36 wherein the DS is equal to the number of ones in the codeword minus the number of zeroes in the codeword.

38. The method of claim 36 further comprising selectively inverting the codeword when an enable signal is received.

39. The method of claim 38 further comprising calculating a running digital sum (RDS) of a plurality of codewords based on the DS.

40. The method of claim 39 further comprising selectively generating the enable signal based on the DS and the RDS.

41. The method of claim 40 further comprising selectively reversing the sign of the DS.

42. The method of claim 41 further comprising selectively generating the enable signal and reversing the sign of the DS when the RDS and the DS have the same sign.

* * * * *

UNITED STATES PATENT AND TRADEMARK OFFICE
CERTIFICATE OF CORRECTION

PATENT NO. : 7,006,016 B1 Page 1 of 1
APPLICATION NO. : 10/937995
DATED : February 28, 2006
INVENTOR(S) : Weishi Feng It is certified that error appears in the above-identified patent and that said Letters Patent is hereby corrected as shown below:

IN THE PATENT:
On the Title, item 56 under "Other Publications"   Delete "Weishi" and insert --Feng--
(See IDS dated 9/10/2004)

Signed and Sealed this

Thirtieth Day of January, 2007

JON W. DUDAS
*Director of the United States Patent and Trademark Office*